(12) United States Patent
Mu

(10) Patent No.: US 7,714,759 B1
(45) Date of Patent: May 11, 2010

(54) LOW POWER LINEAR INTERPOLATION DIGITAL-TO-ANALOG CONVERSION

(75) Inventor: Fenghao Mu, Hjärup (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 43 days.

(21) Appl. No.: 12/254,441

(22) Filed: Oct. 20, 2008

(51) Int. Cl.
*H03M 1/78* (2006.01)
(52) U.S. Cl. .................................. 341/154; 341/144
(58) Field of Classification Search .......... 341/144–160
See application file for complete search history.

(56) References Cited

U.S. PATENT DOCUMENTS

| | | | |
|---|---|---|---|
| 4,017,846 | A | 4/1977 | Aramaki |
| 5,525,986 | A | 6/1996 | Kovacs et al. |
| 5,627,538 | A | 5/1997 | Ferry |
| 5,684,481 | A * | 11/1997 | Ashe ........................... 341/154 |
| 5,870,045 | A | 2/1999 | Hamanishi et al. |
| 6,181,263 | B1 | 1/2001 | Malik et al. |
| 6,222,473 | B1 * | 4/2001 | Castaneda et al. ........... 341/154 |
| 6,246,351 | B1 | 6/2001 | Yilmaz |
| 6,380,877 | B2 * | 4/2002 | Castaneda et al. ........... 341/154 |
| 7,161,517 | B1 | 1/2007 | Yen et al. |
| 7,164,328 | B2 | 1/2007 | Yuan et al. |
| 7,242,338 | B2 | 7/2007 | Jiang et al. |
| 7,312,739 | B1 | 12/2007 | Sutardja et al. |
| 7,327,299 | B2 | 2/2008 | Yen et al. |
| 7,468,686 | B2 * | 12/2008 | Brubaker ..................... 341/154 |

2004/0233088 A1   11/2004   Mallinson

FOREIGN PATENT DOCUMENTS

WO       2008077387 A2    7/2008

OTHER PUBLICATIONS

Author Unknown. "Digital-to-Analog Conversion." Publication date unknown. Internet article available at: http://hyperphysics.phy-astr.gsu.edu/hbase/electronic/dac.html.
Wang, H.-W. et al. "High Speed CMOS Digital-to-Analog Converter with Linearinterpolator." IEEE Transactions on Consumer Electronics, vol. 46, Issue 4, Nov. 2000, pp. 1137-1142.
Wang et al., "Circuit Design of a D/A Converter Using Spline Functions," Signal Processing, Mar. 1989, pp. 279-288, vol. 16, No. 3, Elesevier Science Publishers B.V., Amsterdam.
Zhou et al., "An 8-Bit 100-MHz CMOs Linear Interpolation DAC," IEEE Journal of Solid-State Circuits, Oct. 2003, pp. 1758-1761, vol. 38, No. 10, IEEE, Piscataway, NJ, US.

* cited by examiner

*Primary Examiner*—Lam T Mai
(74) *Attorney, Agent, or Firm*—Coats & Bennett, P.L.L.C.

(57) ABSTRACT

A resistor network digital-to-analog converter (DAC) subdivides each sampling clock cycle of the DAC into a number of phases. For at least one bit input of the DAC associated with a desired input resistor weight, the input bit value is sampled at each phase. Each of those sampled values is then applied to a respective resistor branch, the parallel set of resistor branches forming the parallel equivalent of the desired input resistor weight for that bit input. Such application may be, for example, via a slew-rate controlled driver, to smooth transient edges in the generated analog output signal. The resulting analog signal experiences reduced reconstruction errors at a higher frequency while consuming less power than a comparable oversampling DAC. Shifting reconstruction errors to higher frequencies relaxes downstream filtering requirements, which simplifies analog signal filtering and allows, for example, the use of current-mode low pass filters.

24 Claims, 13 Drawing Sheets

LOW POWER LINEAR INTERPOLATION DIGITAL-TO-ANALOG CONVERSION

TECHNICAL FIELD

The present invention generally relates to resistor network digital-to-analog conversion methods and apparatus, and particularly relates to low power digital-to-analog conversion using linear interpolation therein.

BACKGROUND

Digital-to-analog converters convert digital words into analog values, such as analog voltage values or analog current values. When the digital word consists of n bits, the corresponding analog value may be generated by applying progressive power of two weightings to each of the n bits.

Conventional resistor network digital-to-analog converters use a network of resistor stages to apply the progressive weightings to each bit. Known resistor network digital-to-analog converters include, for example, binary weighted digital-to-analog converters and R/2R ladder digital-to-analog converters. These conventional resistor network digital-to-analog converters sample each bit at a reconstruction clock frequency, $f_s$, and apply those sampled bit values to progressively weighted resistor stages. Each of these stages, however, introduces reconstruction error into the analog output signal in the form of both static error and transient error (e.g. noise spikes).

Increasing $f_s$ has the advantage of moving these reconstruction errors introduced by the resistor network to a higher frequency, thereby relaxing the design requirements for filtering out those reconstruction errors. This increase, however, results in the digital-to-analog converter consuming more power. The higher power consumption may be unacceptable in low power applications, such as mobile communication devices.

SUMMARY

Methods and apparatus taught herein advantageously move reconstruction errors of a resistor network digital to analog converter (DAC) to frequencies outside the range of interest while consuming less power than would be required to obtain similar frequency shifting through an increase in the reconstruction clock. Instead of increasing the reconstruction clock frequency, the methods and apparatus taught herein subdivide each sampling clock cycle of the DAC into a number of phases.

For at least one bit input of the DAC that is associated with a desired input resistor weight, the input bit value is sampled at each phase. Each of those sampled values is then applied to a respective resistor branch, and the parallel set of resistor branches forms the parallel equivalent of the desired input resistor weight for that bit input. Doing so effectively applies the bit value in weighted form to the resistor network in a step-wise, linear interpolation process that eliminates or reduces both the static and transient effects in the analog output signal associated with applying the bit value.

In one or more embodiments, a resistor network DAC includes a set of bit input circuits, an analog signal output circuit, and a clocking circuit. The set of bit input circuits is configured to receive input bit values of an n-bit digital word. Each bit input circuit has an input sampling circuit configured to sample an input bit value according to clock signals of the clocking circuit and a driver circuit to apply the sampled value to an associated input resistor having a desired input resistor weight. The clocking circuit comprises a multi-phase clock generator configured to subdivide each sampling clock cycle of the DAC into a number of phases. For at least one bit input, the sampling circuit comprises a number of parallel sampling circuits configured to each sample the input bit value at a different one of those equally spaced phases. Likewise, the driver circuit within that bit input comprises a corresponding number of parallel driver circuits each configured to apply the corresponding sampled value to a respective resistor branch. Because the parallel combination of all respective resistor branches forms the equivalent of the desired input resistor weight for that bit input circuit, the desired contribution of that input bit value is spread over the entire sampling clock period. The analog signal output circuit is configured to generate the analog (output) signal as the resistor-weighted sum of all input bit values.

Additionally or alternatively, one or more method and apparatus embodiments presented herein apply each sampled value to its respective resistor branch via a slew-rate controlled driver, to smooth the analog signal transient edges at the output nodes of the resistor network. That is, the bit inputs that are configured as multi-phase bit inputs use slew-rate controlled drivers for the sampled values, to further smooth output signal transient edges. Such slew-rate controlled drivers may comprise a current-mirror circuit tied to a slew-rate limiting current source. Alternatively, the slew-rate controlled drivers may each comprise a delay circuit configured to generate a number of instances of the sampled value, each instance being the sampled value delayed by an increasing number of delay units, and a parallel driver set circuit, each driver within the set having its input driven by a different one of those instances.

In another embodiment taught herein, the resistor network DAC comprises part of a communication transmitter and is configured to convert a baseband communication signal into an analog signal. The resistor network DAC may be further configured to provide the analog signal to a current-mode low-pass filter circuit, for filtering in advance of current mode modulation.

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
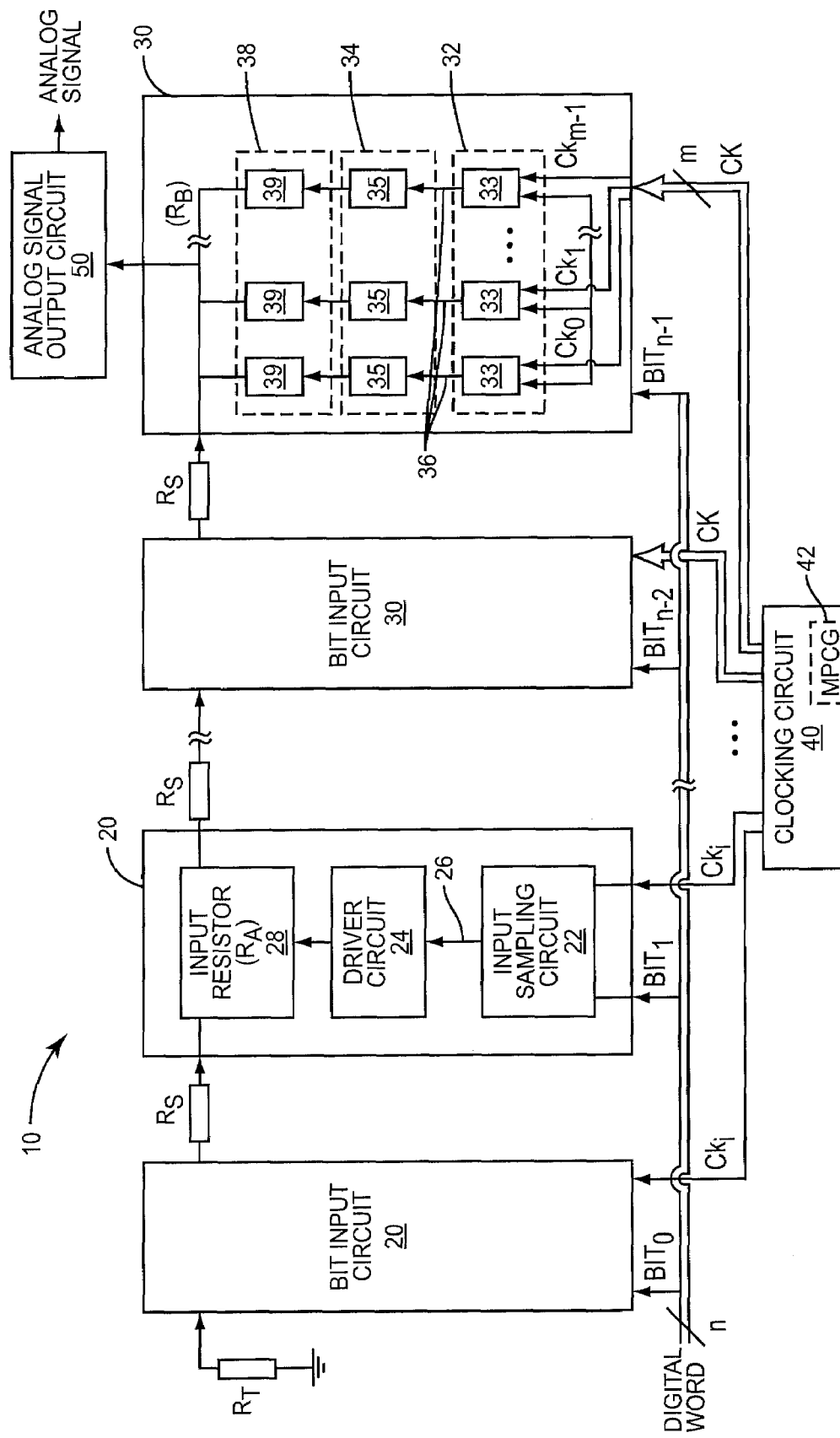
FIG. 1 is a block diagram illustrating one embodiment of a resistor network digital-to-analog converter of the present invention.

FIG. 1 illustrates one embodiment of a resistor network digital-to-analog converter (DAC) 10, which receives an n-bit digital word and generates an analog signal representation thereof. The resistor network DAC 10 includes a set of bit inputs circuits 20, 30, a clocking circuit 40, and an analog signal output circuit 50.

The set of bit inputs circuits 20, 30 is configured to receive input bit values ($Bit_0$, $Bit_1$ ... $Bit_{n-1}$) of an n-bit digital word. Each bit input circuit 20, 30 has an input sampling circuit 22, 32 configured to successively sample the input bit values with a fixed delay and a driver circuit 24, 34 configured to apply the sampled value(s) 26, 36 to an associated input resistor 28, 38 having a desired input resistor weight $R_A$, $R_B$. The desired input resistor weights $R_A$, $R_B$ may be, for example, proportional to the desired contribution of the corresponding input bit value to the analog signal during a given sampling clock period.

The contributions of all bit input circuits 20, 30, as resistor-weighted input bit values, are combined via bridge resistors Rs and termination resistor $R_T$. These contributions are then input into the analog signal output circuit 50. The analog signal output circuit 50 is configured to generate an analog signal as the sum of the resistor-weighted input bit values of each bit input circuit 20, 30.

In order to sample those input bit values, each input sampling circuit 22, 32 receives one or more clock signals ($Ck_i$, CK) provided by the clocking circuit 40. The clocking circuit 40 comprises a multi-phase clock generator 42 configured to subdivide each sampling clock cycle of the resistor network DAC 10 into m phases ($Ck_0$, $Ck_1$ ... $Ck_{m-1}$) at reconstruction clock frequency $f_s$. The phase difference or delay, $P_m$, between two successive phases is $P_s/m$, where $P_s$ equals the clock period of the reconstruction clock $f_s$.

The bit input circuit(s) 20 are single-phase circuits clocked, e.g., by one of the m clock signals $Ck_i$ (i=0, 1 ... m−1), or by another clock signal at the reconstruction clock frequency $f_s$. In contrast, the bit input circuit(s) 30 are multi-phase bit input circuits that are clocked by some or all of the m clock signals, CK, each at a different phase. For each bit input circuit 30, the sampling circuit 32 comprises m parallel sampling circuits 33 configured to each sample the corresponding input bit value at a different one of the m phases ($Ck_0$, $Ck_1$ ... $Ck_{m-1}$). The sampling circuit 32, therefore, generates m sampled values 36, each of which represents the corresponding input bit value sampled at a different equally spaced phase or time interval. Each of these m sampled values 36 serves as an input into a different one of m parallel driver circuits 35 within the driver circuit 34. The parallel driver circuits 35 are configured to each apply a sampled value 36 to a respective resistor branch 39 within the associated input resistor 38.

Because each sampled value 36 represents the corresponding input bit value during a successive time interval, such operation has the effect of cumulatively applying during successive time intervals the corresponding input bit value to the respective resistor branches 39. The parallel combination of these respective resistor branches 39 forms the equivalent of the desired input resistor weight $R_B$ of the associated input resistor 38. Thus, the corresponding input bit value is applied to a portion of the desired input resistor weight $R_B$ during successive time intervals and the desired contribution of the input bit value is spread linearly over the entire sampling clock period. Such linear interpolation effectively increases the frequency of amplitude transitions in the analog output signal so as to shift the reconstruction error due to the at least one bit input circuit 30 into a frequency outside the range of interest, specifically m*$f_s$. Advantageously, shifting the reconstruction error to frequency m*$f_s$ in this manner consumes less power than oversampling at that same frequency.

Those skilled in the art will appreciate that the resistor network DAC 10 may be implemented with such linear interpolation as described above for any number of its bit inputs, e.g., any mix of single-phase bit input circuits 20 and multi-phase bit input circuits 30 can be used. For example, bit input circuits 30 can be used for all n bit inputs. In practice, though, the least significant bit inputs contribute little to the reconstruction errors within the analog signal output. Thus, using bit input circuits 30 for the least significant bits may be unnecessary for those applications which tolerate at least minimal reconstruction errors.

For the least significant bit input circuits 20 which may receive only a single clock signal $Ck_i$, i=0, 1, ..., m−1, the sampling circuit 22 only samples its corresponding input bit value at one of the m phases, $Ck_i$, thereby generating the sampled value 26. While sampling circuit 22 may use any of these m phases to sample the input bit value, use of i=m/2 can reduce the small time introduced error. Regardless of the phase at which the sampled value 26 is generated, though, the driver circuit 24 within each bit input circuit 20 is configured to apply that sampled value 26 to the associated input resistor 28 having the desired input resistor weight $R_A$. Thus, the corresponding input bit value is applied to the desired input resistor weight $R_A$ all at once and the desired contribution of the input bit value occurs entirely at the beginning of the sampling clock period.

Regardless of the application, however, it should be noted that the desired input resistor weights $R_A$, $R_B$, as well as the bridge resistors Rs and the termination resistor $R_T$, may depend on the type of resistor network DAC 10 being implemented. For example, where the resistor network DAC 10 comprises an R/2R ladder DAC the bridge resistors Rs may couple adjacent bit input circuits 20, 30 through a resistance Rs=R and each of the input resistor weights $R_A$, $R_B$, as well as the termination resistor $R_T$, are desired to be equal to 2R. On the other hand, where the resistor network DAC 10 comprises a binary weighted resistor DAC, the input resistor binary weight $R_A$ of least significant bits is desired to be $2^i$ times greater than the input resistor binary weight $R_B$ corresponding to the bit i, where i=1, 2, ..., n−1, and the bridge resistors Rs may not contribute any series resistance, i.e, Rs=0. The termination resistor Rt connected at the bridge node of the least significant bit is infinitive large in the case of binary weighted resistor implementation.

Figure 2:
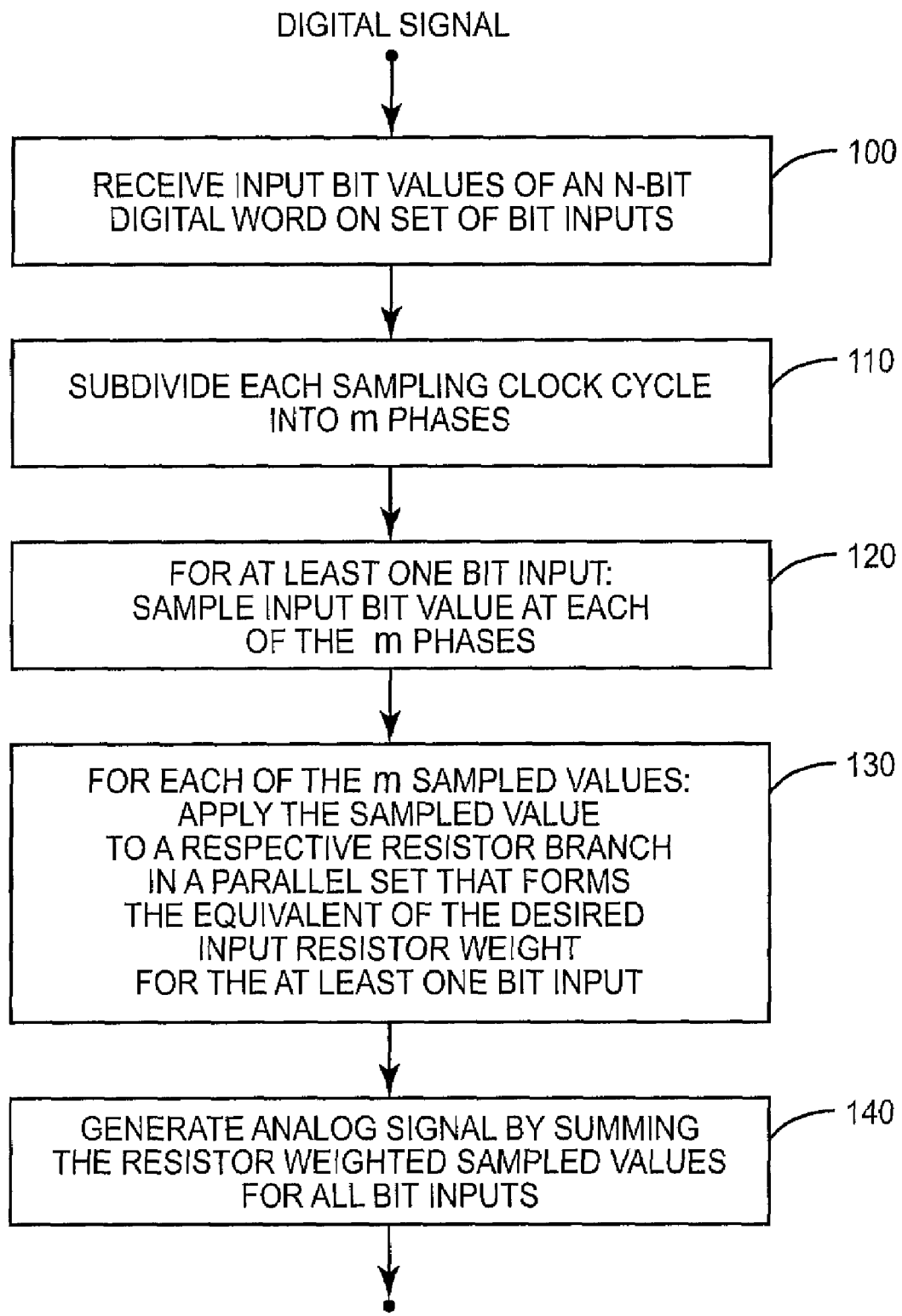
FIG. 2 is a logic flow diagram illustrating one embodiment of a resistor network digital-to-analog converter of the present invention.

Whether the resistor network DAC 10 comprises an R/2R ladder DAC or a binary weighted resistor DAC, however, the resistor network DAC 10 implements a method of converting a digital signal into an analog signal, an example of which is given in FIG. 2. The illustrated conversion "begins" with the resistor network DAC 10 receiving input bit values of an n-bit digital word on the set of bit input circuits 20, 30 (Block 100). The multiphase clock generator 42 subdivides each sampling clock cycle of the clocking circuit 40 into m phases (Block 110), and the sampling circuit 32 of each bit input circuit 30 samples the respective input bit value at each of the m phases (Block 120). For each of those sampled values 36, a parallel driver circuit 35 applies the sampled value 36 to a respective resistor branch 39 in a parallel set of resistor branches 39 that form the parallel equivalent of the desired input resistor weight $R_B$ for that at least one bit input circuit 30 (Block 130). That is, each sampled value is applied at a respective one of the clock phases, which effectively results in the overall contribution of the input bit value being accumulated incrementally over the reconstruction frequency clock period. The overall conversion operation includes the analog signal output circuit 50 generating the analog signal by summing the resistor weighted sampled values for all bit input circuits 20, 30 (Block 140).

In order for the analog signal output circuit 50 to sum the resistor weighted sampled values in such a manner, the analog signal output circuit 50 may comprise, for example, a summer circuit consisting of either an operational amplifier using feedback for a unity gain, or just a resistor for providing a voltage output in the case that output current equals zero. Alternatively, the output of the bit input circuits 20, 30 may be used directly as the analog signal. In this instance, the analog signal output circuit 50 may simply connect these outputs together without the use of an operational amplifier or any resistance. Those skilled in the art will appreciate, however, that other summer circuits may also be used to add the resistor weighted sampled values.

Those skilled in the art will also appreciate various implementations of the multiphase clock generator 42 used to subdivide each sampling clock cycle of clocking circuit 40 into m phases. A delay locked loop (DLL), or a phase locked loop (PLL), for example, can be employed to create these m phases at reconstruction clock frequency $f_s$. Alternatively, a clock at frequency of $m*f_s$ may be used and the m phases at frequency $f_s$ generated using divide-by-m.

Figure 3A:
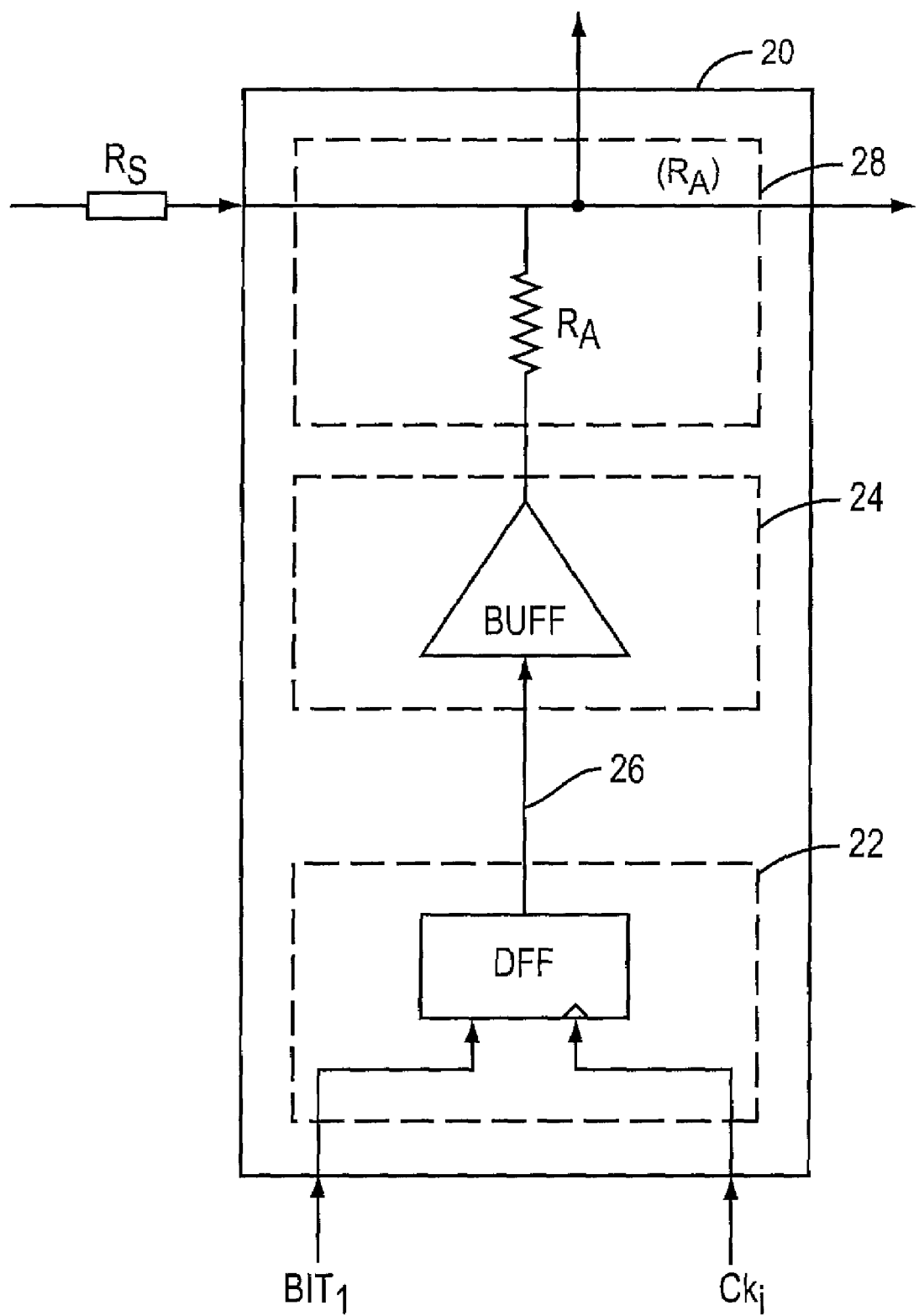
FIGS. 3A and 3B are schematic diagrams of example embodiments of the bit input circuits for the resistor network digital-to-analog converter of FIG. 1.
Figure 3B:
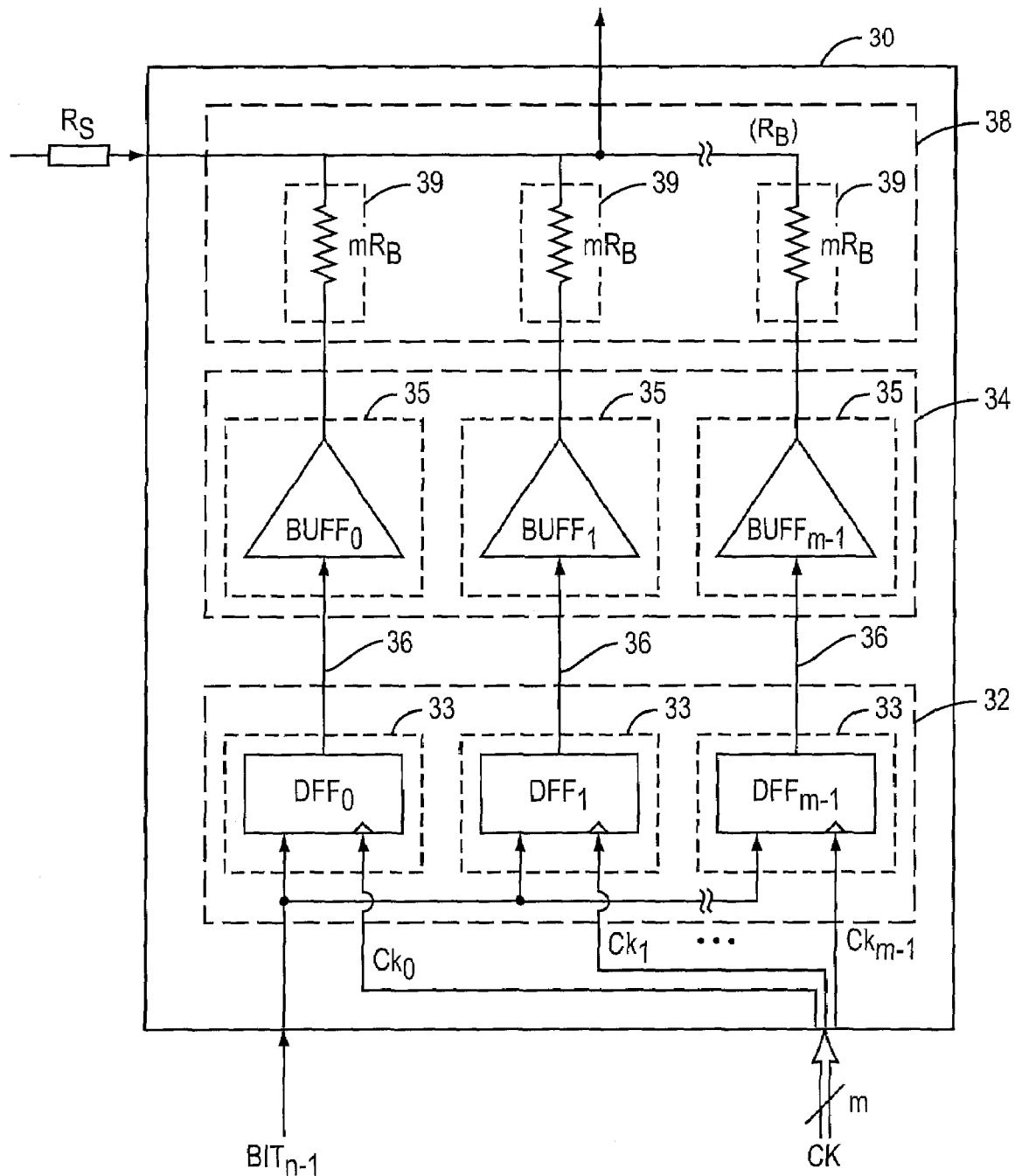

Example implementations of the bit input circuits 20, 30 are illustrated in FIGS. 3A and 3B. It should be understood that these detailed examples are non-limiting illustrations of physical and/or functional circuit arrangements offering advantageous operation in certain applications.

FIG. 3A illustrates one example of an implementation of a least significant bit input circuit 20. As the bit input circuit 20 receives only a single clocking signal $Ck_i$ from the clocking circuit 40, a single delay flip-flop, DFF, is used as the sampling circuit 22. The DFF latches the input bit value (Bit 1) into memory on the trig (rising/falling) edge of $Ck_i$ and holds that sampled value 26 for the entire sampling clocking cycle. Therefore, upon the rising edge of $Ck_i$ and for the remainder of the sampling clock cycle, a buffer, BUFF, within the driver circuit 24 applies that sampled value 26 to the associated input resistor 28. The associated input resistor 28 comprises a single resistor representing the entire desired input resistor weight $R_A$ for the bit input circuit 20. Thus, as mentioned previously, the buffer, BUFF, applies the entire desired contribution of the input bit value (Bit 1) at the beginning of and throughout the sampling clock period.

In the example implementation of a multi-phase bit input circuit 30, which is advantageously used for one or more of the most significant input bits, on the other hand, FIG. 3B illustrates how the bit input circuit 30 linearly spreads the desired contribution of the input bit value over the sampling clock period. The bit input circuit 30 receives m clock signals CK offset in phase into the m parallel sampling circuits 33, each of which comprise one of m delay flip-flops (DFF$_0$, DFF$_1$ ... DFF$_{m-1}$). Each of the m DFFs latches the input bit value (Bit$_{n-1}$) into its respective memory on the trig edge of its respective clock signal and holds that sampled value 36 until clocked again. These sampled values 36 are applied to a respective resistor branch 39 via one of the m parallel driver circuits 35, which comprises m buffers (BUFF$_0$, BUFF$_1$ ... BUFF$_{m-1}$). The m resistor branches 39 likewise comprise m resistors, each with a resistance of $m*R_B$ so that the parallel equivalent of the m resistors equals the desired input resistor weight $R_B$. Thus, the input bit value (Bit$_{n-1}$) is applied to each of the m resistors, representing a portion of the desired input resistor weight $R_B$, during successive time intervals.

Figure 4:
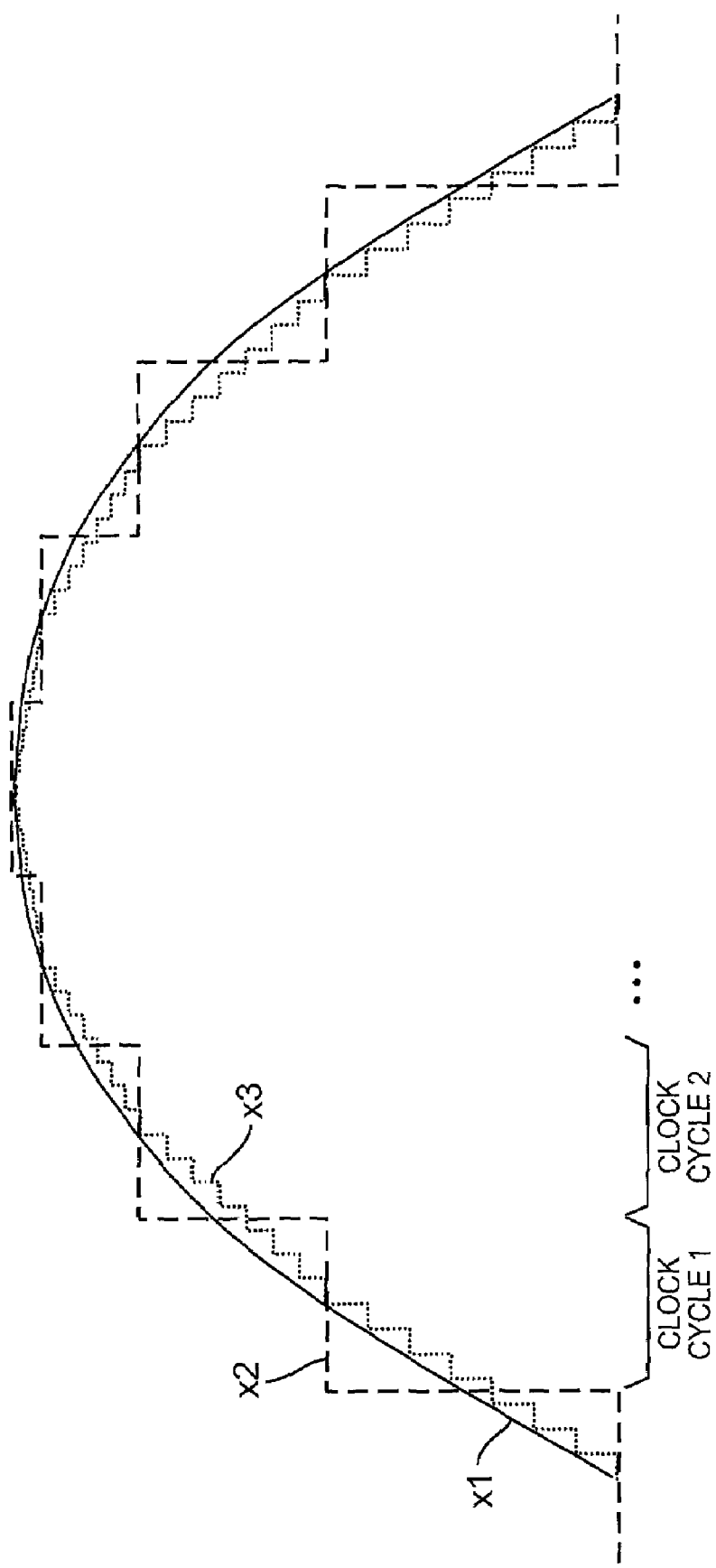
FIG. 4 is a waveform diagram comparing a conventional reconstructed analog waveform without linear-interpolation error reduction to a reconstructed analog waveform with linear-interpolation error reduction as provided by the resistor network digital to analog converter of FIG. 1.

The advantages of the resulting analog signal generated by such a resistor network DAC 10 having bit input circuits 30 are illustrated in FIG. 4. Plotted within FIG. 4 is an original analog signal x1, the reconstructed analog signal x2 generated by a conventional resistor network DAC with reconstruction frequency $f_s$, and the reconstructed analog signal x3 generated by the above-described resistor network DAC 10 also at $f_s$. A conventional resistor network DAC outputs a reconstructed analog signal x2 with large steps at the beginning of each clock cycle, resulting in relatively large reconstruction errors within the frequency band of interest.

In contrast, the reconstructed analog signal x3 depicts the output of the above-described resistor network DAC 10. One sees that the incremental, multi-phase application of one or more of the most significant input bit values reduces the reconstruction error at any given time instant, and, furthermore, maps such errors into a higher frequency, $m*f_s$.

Yet in order to further reduce the reconstruction errors introduced into the reconstructed analog signal, the parallel driver circuits 35 may comprise parallel slew-rate controlled driver circuits 35. These parallel slew-rate controlled driver circuits 35 are further configured to each smooth transient edges in the generated analog output signal.

Figure 5:
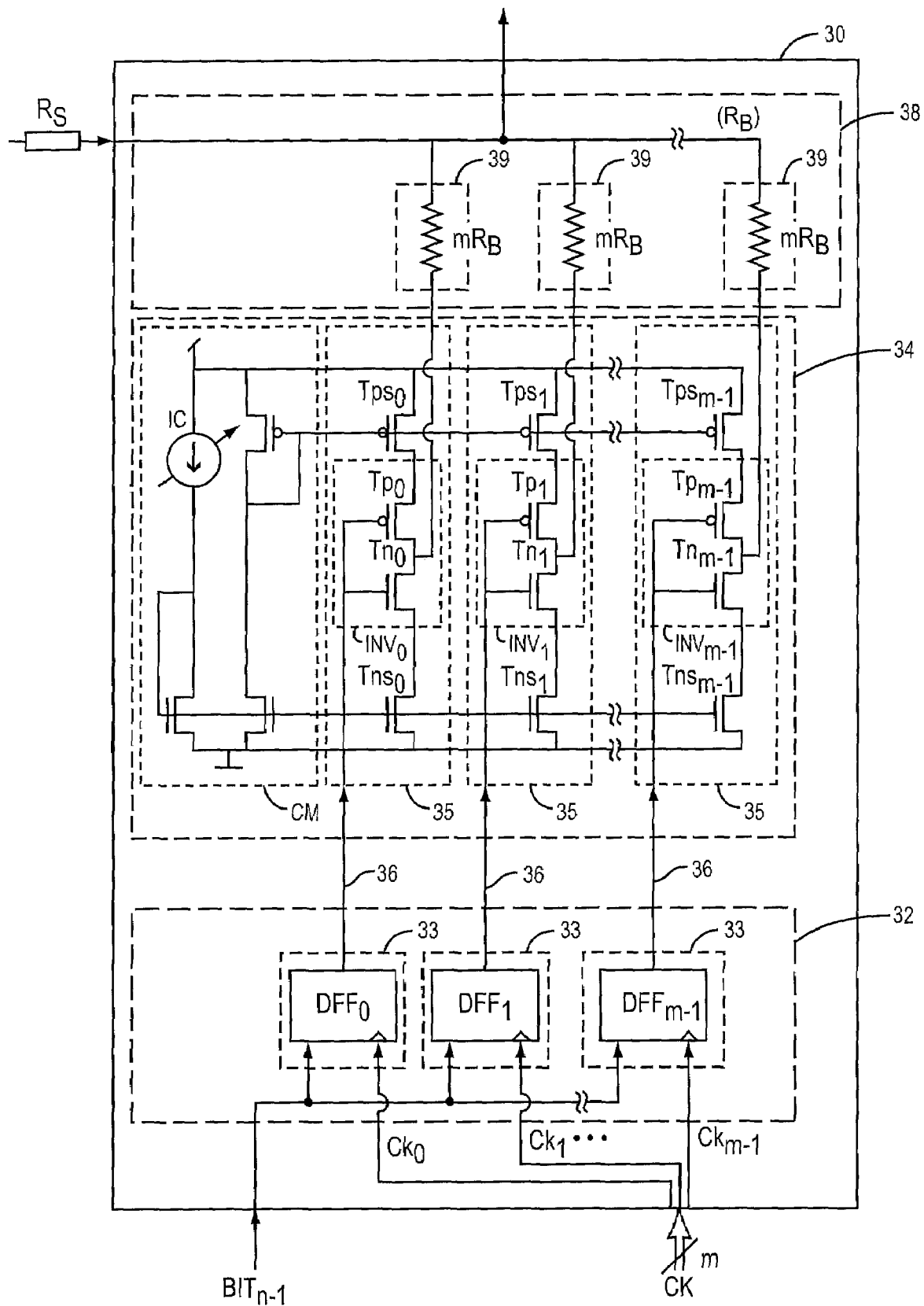
FIG. 5 is a schematic diagram of one embodiment of slew-rate controlled drivers, each comprising a current-mirror circuit tied to a slew-rate limiting current source.

FIG. 5 illustrates one example of such an embodiment having parallel slew-rate controlled driver circuits 35. The bit input circuit 30 shown in FIG. 5 essentially imitates that previously described in FIG. 3B, with the exception that the parallel driver circuits 35 each comprise an inverter circuit (INV$_0$, INV$_1$ ... INV$_{m-1}$) coupled to a current-mirror circuit, CM, tied to a slew-rate limiting current source, IC.

As shown in FIG. 5, the current-mirror circuit CM is connected to each of transistors Tps$_0$, Tps$_1$ ... Tps$_{m-1}$ and Tns$_0$, Tns$_1$ ... Tns$_{m-1}$ so as to mirror the slew-rate limiting current IC through each of the inverting buffers (INV$_0$, INV$_1$ ... INV$_{m-1}$) comprised of transistors (Tp$_0$,Tn$_0$), (Tp$_1$,Tn$_1$) ... (Tp$_{m-1}$,Tn$_{m-1}$). In operation, then, the slew-rate limiting current source, IC, limits the rate at which a sampled value 36 may be applied by each inverting buffer (INV$_0$, INV$_1$ ... INV$_{m-1}$) to a resistor branch 39.

For example, when the sampled value 36 as output from DFF$_0$ changes from low to high, such change occurs at a given slew rate. Upon such a change, the high voltage at the output of the inverting buffer INV$_0$ discharges the capacitance on the output node through transistor Tn$_0$ as well as transistor Tns$_0$. The capacitance includes all parasitic capacitances in output nodes, like device parasitic capacitance and routing parasitic capacitance. The slew-rate at which that output is pulled down toward ground, however, is limited by the value of IC which is mirrored in $Tns_0$. Thus, the output of the inverting buffer $INV_0$ will change from high to low at an independent slew rate which is controlled by the magnitude of the current source IC. Those skilled in the art, then, will appreciate that the magnitude of the slew-rate limiting current source IC may be tuned accordingly in order to reduce transients in the analog signal output by analog signal output circuit 50.

Figure 6:
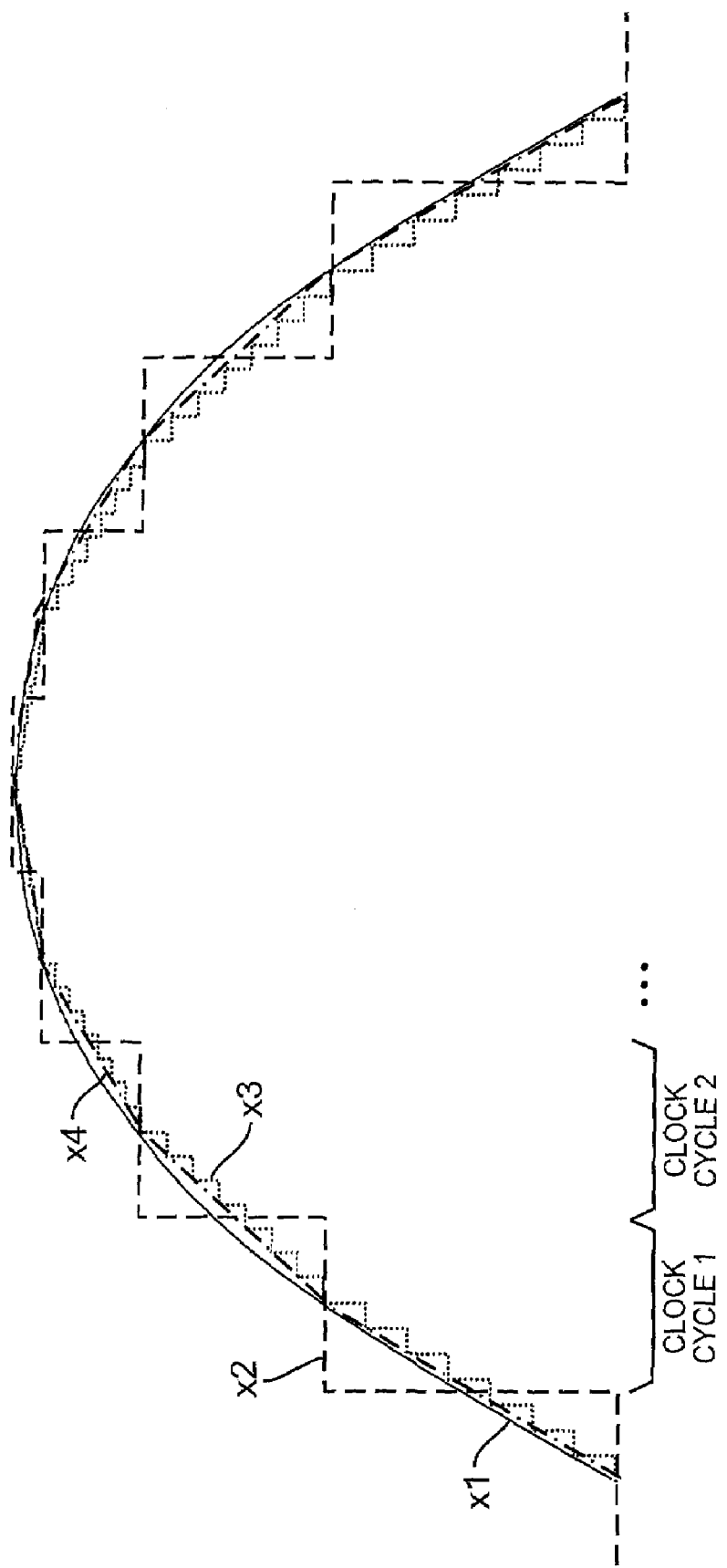
FIG. 6 is a waveform diagram similar to that shown in FIG. 4, but where the reconstructed analog waveform with linear-interpolation error reduction is further improved through the use of the slew-rate controlled drivers of FIG. 5.

Even absent such tuning, however, FIG. 6 illustrates the additional advantages of such a resistor network DAC 10 having the above-described parallel slew-rate controlled driver circuits 35. The plot of FIG. 6 essentially imitates that previously described in FIG. 4, except for the addition of the reconstructed analog signal, x4, generated by a resistor network DAC 10 having parallel slew-rate controlled driver circuits 35. This resistor network DAC 10 outputs a reconstructed analog signal x4 similar to that of x3, but with a slower slew rate. Such results in even smaller reconstruction errors while still mapping these errors into a higher frequency.

Figure 7:
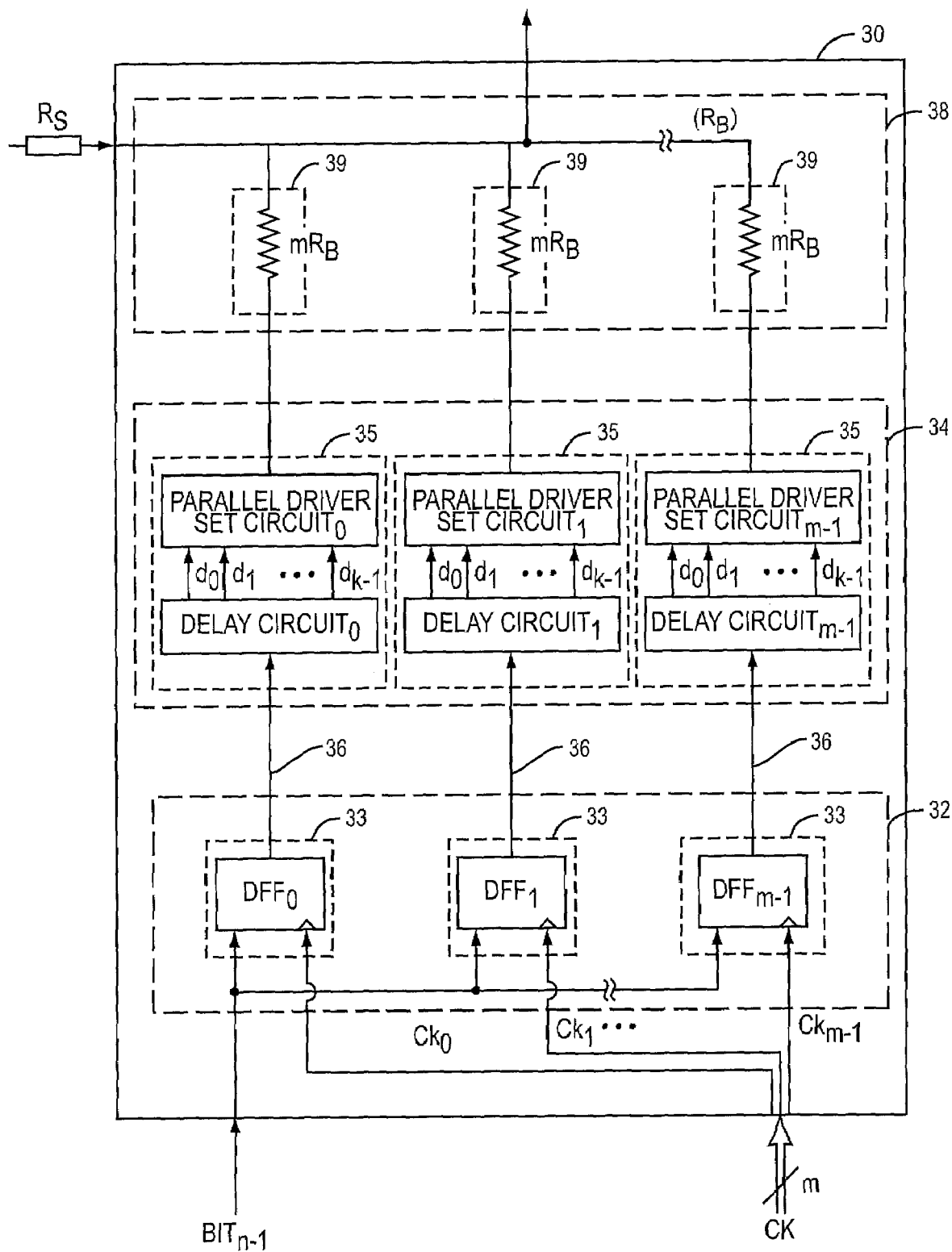
FIG. 7 is a block diagram of another embodiment of slew-rate controlled drivers, each comprising a delay circuit and a parallel driver set circuit.

Furthermore, these same advantages may be obtained from the alternative embodiment of FIG. 7 which illustrates an alternative resistor network DAC 10 comprising parallel slew-rate controlled driver circuits 35. Again, the bit input circuit 30 shown in FIG. 7 essentially imitates that previously described in FIG. 3B, with the exception that the parallel driver circuits 35 each comprise a delay circuit and a parallel driver set circuit.

In FIG. 7, the delay circuit within each parallel driver circuit 35 is configured to generate k instances ($d_0, d_1 \ldots d_{k-1}$) of the sampled value 36, each instance being the sampled value 36 delayed by an increasing number of delay units. A delay unit may have a delay, for example, of $P_k=P_s/(mk)=P_m/k$. The parallel driver set circuit within each parallel driver circuit 35 itself comprises a parallel set of drivers, each such driver having its input driven by a different one of the instances ($d_0, d_1 \ldots d_{k-1}$).

Figure 8:
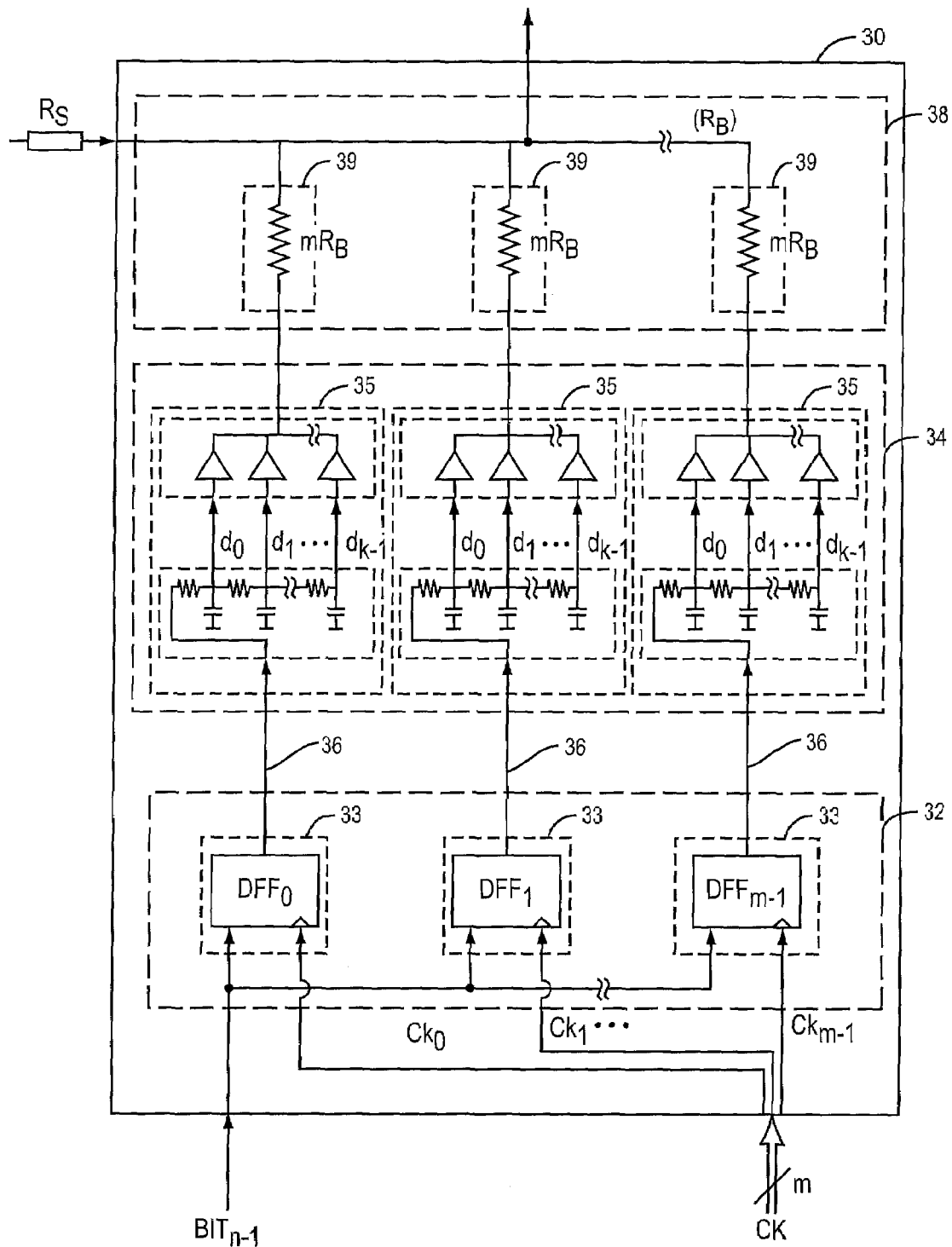
FIG. 8 is a schematic diagram for one embodiment of the delay circuits and parallel driver set circuits for the slew-rate controlled drivers of FIG. 7.
Figure 9:
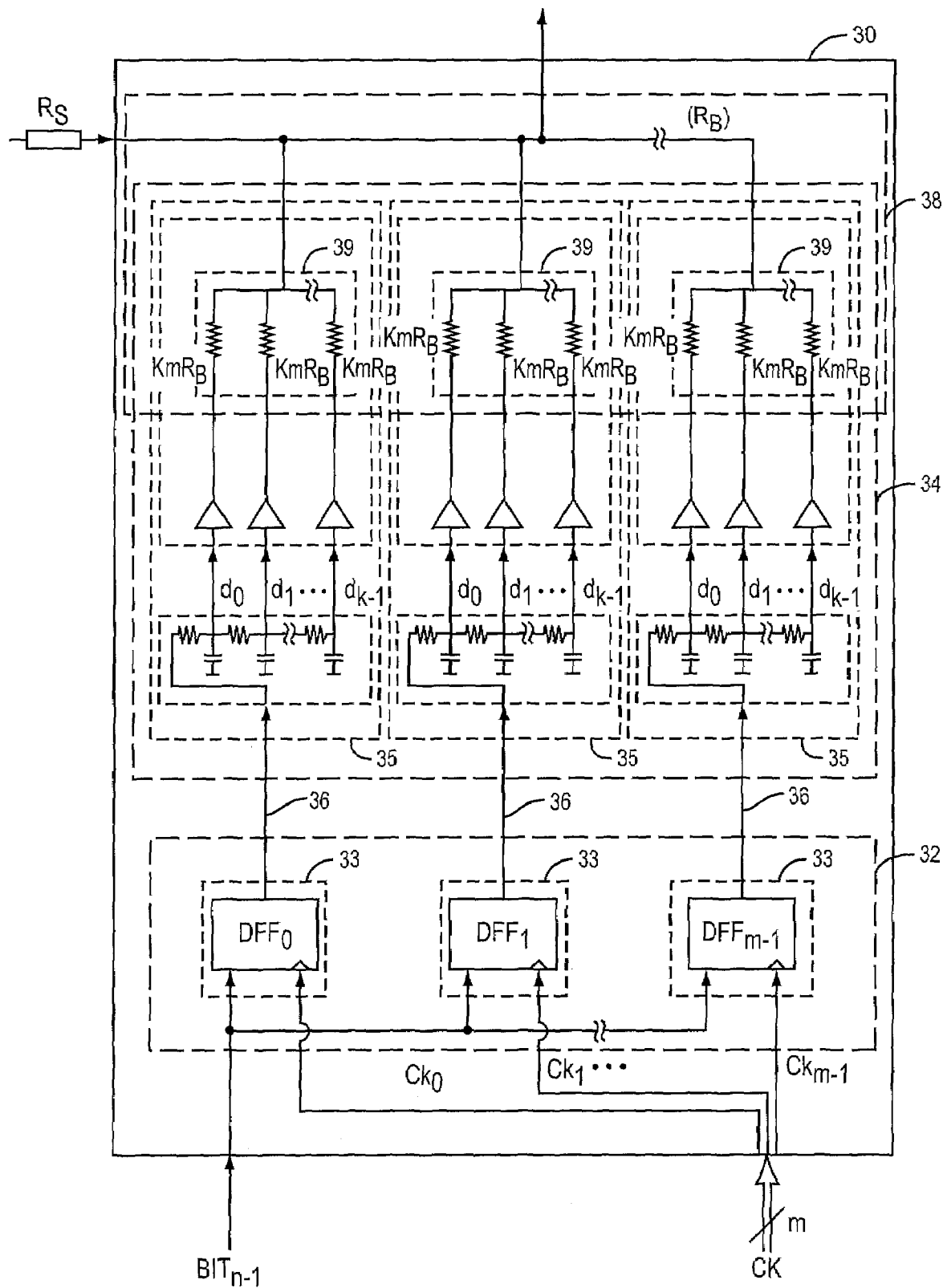
FIG. 9 is a schematic diagram of another embodiment of the delay circuits and parallel driver circuits for the slew-rate controlled drivers of FIG. 7.

Those skilled in the art will appreciate that the above-described delay circuit and parallel driver set circuit may be implemented in a variety of ways. FIGS. 8 and 9, however, illustrate two such implementations.

In FIG. 8, the delay circuit comprises a series of k cascaded resistive-capacitive segments, each of which imposes an additional small delay unit on the sampled value 36 proportional to its RC constant. Imposing these small delay units via cascaded resistive-capacitive segments is more effective than accomplishing the same with a PLL or DLL using very high speed delay cells. Furthermore, because the delay is small, the distortion introduced by the delay can be ignored. Thus, one of k instances is taken between each of the k resistive-capacitive segments, each instance, therefore, being the sampled value 36 delayed by an increasing number of delay units. Each of the k instances is input into one of k drivers which comprise the parallel driver set circuit. The combination of all delayed sampled values is then applied to the respective resistor branch 39 having resistance $m*R_B$.

Alternatively, in FIG. 9, all delayed sampled values are first applied to a parallel set of k resistors before being combined. Each of the k resistors likewise has a resistance of $k*m*R_B$ so as to form the parallel equivalent of the respective resistor branch 39 having resistance $m*R_B$.

Figure 10:
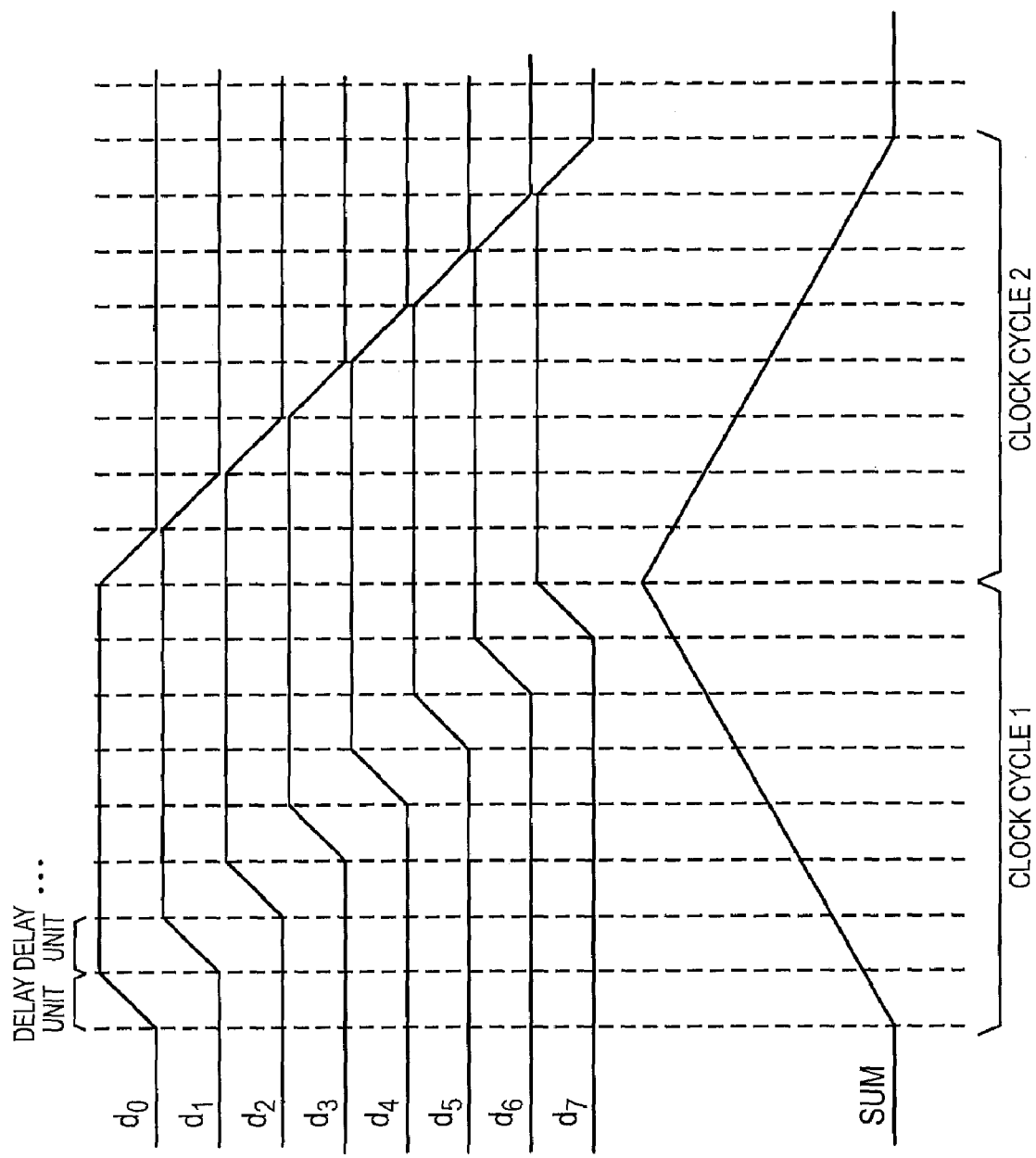
FIG. 10 is a waveform diagram depicting the generation of delayed instances of a sampled bit input value according to the delay circuit of FIG. 7 and the combination of those delayed instances according to the parallel driver set circuit of FIG. 7.

When k=8 in either of these implementations, the result of imposing the sampled value 36 to a delay circuit and a parallel driver set circuit can be seen in FIG. 10 for two clock cycles. Each of the 8 instances ($d_0, d_1 \ldots d_7$) comprises the sampled value 36 delayed by an increasing number of delay units. For example, the first instance, $d_0$, is the sampled value 36 delayed by one delay unit, the second instance, $d_1$, is the sampled value 36 delayed by two delay units, and so on. When each of these instances serves as the input into one of the drivers within the parallel set of drivers, the respective resistor branch 39 is driven with the summation of all 8 instances. As can be seen from FIG. 10, such summation has a slower slew rate than any of the instances of the sampled value 36.

Those skilled in the art will appreciate that the magnitude of the delay unit $P_k$ may be tuned accordingly in order to smooth transient edges in the analog signal generated by analog signal output circuit 50. Where the delay units are formed with a series of k cascaded resistive-capacitive segments, as in FIGS. 8 and 9, the RC constant of those resistive-capacitive segments may be chosen to produce such a tuned delay unit $P_k$.

Figure 11:
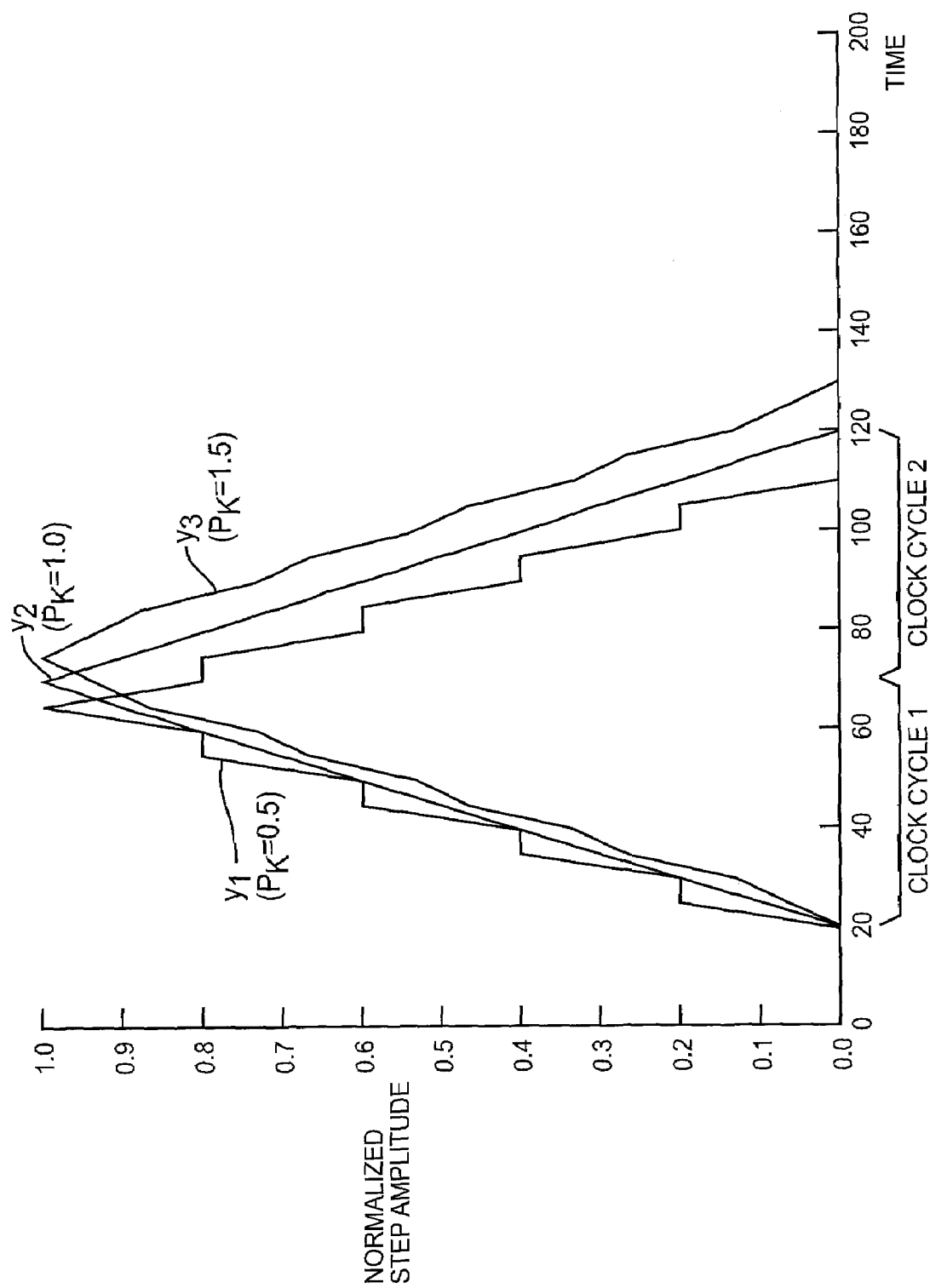
FIG. 11 is a waveform diagram for the reconstruction curves for various tuning of the delay units in the slew-rate controlled drivers of FIG. 7.

To illustrate the effects of such tuning, FIG. 11 shows a number of reconstruction curves where the magnitude of the delay unit $P_k$ has been tuned to different values. With a normalized delay unit $P_k$=0.5, the resulting reconstruction curve y1 experiences non-linearity with steps occurring within each clock cycle of frequency $m*f_s$(here m=4). Tuning the delay unit $P_k$ to 0.5 also results in a reconstruction curve y1 whose timing leads that of the reconstruction clock cycle of frequency fs (clock cycle 1 in FIG. 11). Optimal timing and linearity, however, may be acquired with a normalized delay unit $P_k$=1.0 as can be seen in the resulting reconstruction curve y2. No such steps occur within the clock cycle and the timing of the curve y2 matches that of the reconstruction clock cycle. Increasing the normalized delay unit $P_k$ to 1.5, however, results in a reconstruction curve y3 whose timing lags that of the reconstruction clock cycle. FIG. 11 demonstrates, then, that the reconstruction curve resulting from a normalized delay unit within a small margin of 1.0 (e.g. 0.8 to 1.2) is acceptable for most applications.

Figure 12:
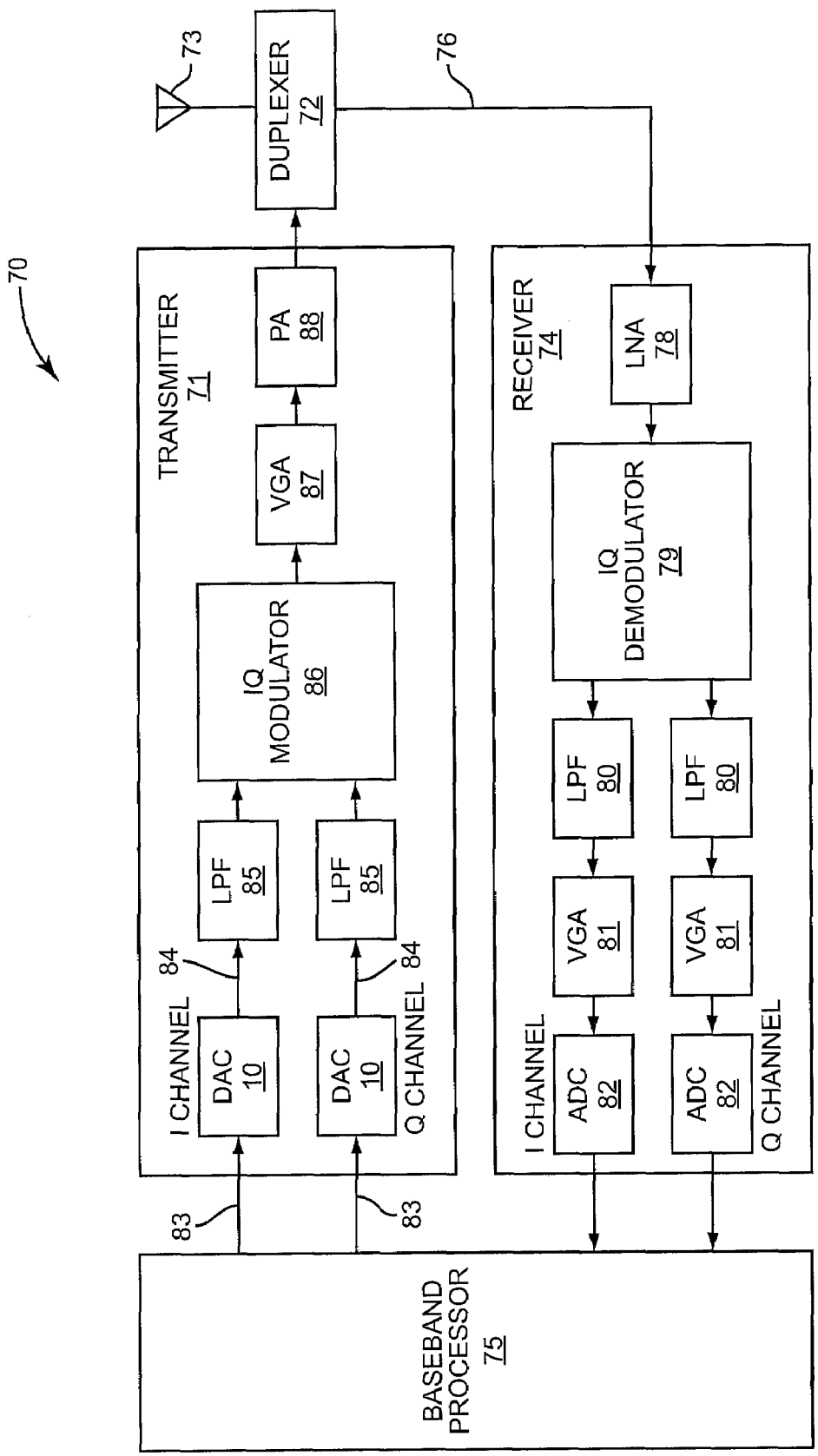
FIG. 12 is a block diagram illustrating one embodiment of the resistor network digital to analog converter of FIG. 1 as applied to a communication transmitter.

One application of the above-described low power resistor network DAC 10 includes wireless mobile communications, where power consumption considerations play a large role in the design of communication transceivers. FIG. 12 illustrates one example of such a communication transceiver 70. The communication transceiver 70 comprises a communication transmitter 71, a duplexer 72, an antenna 73, a communication receiver 74, and a baseband processor 75.

In FIG. 12, radio frequency signals are received from the antenna 73 via the duplexer 72 which provides filter functions and isolates the received signals 76 and the transmitted signals 77. The received signals 76 are input into the communication receiver 74, which comprises a low noise amplifier (LNA) 78, an IQ demodulator 79, and a low pass filter (LPF) 80, variable gain amplifier (VGA) 81, and an analog-to-digital converter (ADC) 82 for each of the I and Q channels. Once received by the communication receiver 74, the received signals 76 are amplified by the low noise amplifier (LNA) 78, and are directly down-converted into baseband signals by the IQ demodulator 79. Each of the baseband I and Q channels are passed through a LPF 80, VGA 81, and an ADC 82 before being input into the baseband processor 75.

On the transmission side, the baseband processor 75 creates baseband communication signals 83, e.g., streams of digital n-bit words at a baseband clock rate or frequency, and feeds each of these signals 83 to the communication transmitter 71. The communication transmitter 71 comprises a resistor network DAC 10 and a low pass filter (LPF) 85 for each of the I and Q channels, an IQ modulator 86, a variable gain amplifier (VGA) 87, and a power amplifier (PA) 88.

Each of the resistor network DACs 10 within the communication transmitter 71 receives one of the baseband communication signals 83. As described above, the resistor network DACs 10 are configured to convert baseband communication signals 83 into analog signals 84. Unlike conventional resistor network DACs, however, the resistor network DACs 10 use linear interpolation to move the reconstruction errors of the analog signals 84 to a higher frequency while consuming less power than would be used for equivalent oversampling of the baseband communication signals 83. With the reconstruction errors of the analog signals 84 at a higher frequency, the design requirements of any LPF 85 used to filter out these errors may be relaxed. Such relaxation permits, but does not require, the use of a LPF 85 whose filter transfer function is not sharp in the transition band.

One non-limiting example of such a LPF 85, the use of which is permitted by the resistor network DACs 10, includes a current-mode LPF. The co-pending and commonly owned U.S. patent application identified by application Ser. No. 12/210,483, filed on 15 Sep. 2008 and entitled "Method and Apparatus for Tunable Current-Mode Filtering," discloses useful examples of current-mode filter circuits, some set in communication transmitter contexts.

While at least some CMLPF circuits have relatively poor attenuation in their transition bands, they advantageously provide current output with low noise, and therefore, permit use of current-mode modulation in the IQ Modulator 86. Current mode modulation improves the linearity of the IQ modulator 86, and thus, use of a CMLPF as the LPF 85 is preferred. The resistor network DACs 10 therefore enable high linearity and low noise modulation while consuming less power than the comparable conventional resistor network DACs. As such, the resistor network DACs 10 are advantageously used to provide the analog signal 84 to a current-mode low-pass filter circuit 85, for filtering in advance of current mode modulation.

Regardless of the type of LPF 85, however, the baseband signals are thereafter up-converted to radio frequency signals in the IQ modulator 86 by multiplying with quadrature transmission clocks. These modulated radio frequency signals are then amplified by the VGA 87 and the PA 88 before being transmitted by the antenna 73 via the duplexer 72.

However, it should be understood that the foregoing description and the accompanying drawings represent non-limiting examples of the methods and individual apparatuses taught herein. As such, the present invention is not limited by the foregoing description and accompanying drawings. Instead, the present invention is limited only by the following claims and their legal equivalents.

What is claimed is:

1. A method of converting a digital signal into an analog signal via a resistor network digital-to-analog converter, DAC, comprising:
   receiving input bit values of an n-bit digital word on respective ones of a set of bit inputs and generating the analog signal as a resistor-weighted sum of the input bits, each bit input associated with a desired input resistor weight;
   subdividing each sampling clock cycle of the DAC into a number of phases;
   for at least one bit input of the DAC, sampling the input bit value at each phase and applying each of the sampled values to a respective resistor branch in a parallel set of resistor branches that form the parallel equivalent of the desired input resistor weight for that at least one bit input.

2. The method of claim 1, wherein applying each of the sampled values to a respective resistor branch comprises applying each sampled value to its respective resistor branch via a slew-rate controlled driver, to smooth transient edges in the generated analog signal.

3. The method of claim 1, wherein applying each of the sampled values to a respective resistor branch comprises driving the respective resistor branch with an inverter circuit coupled to a current-mirror circuit tied to a slew-rate limiting current source.

4. The method of claim 3, wherein the slew-rate limiting current source is tuned to smooth transient edges in the generated analog signal.

5. The method of claim 1, wherein applying each of the sampled values to a respective resistor branch comprises:
   generating a number of instances of the sampled value, each instance being the sampled value delayed by an increasing number of delay units; and
   driving the respective resistor branch with a parallel set of drivers, each such driver having its input driven by a different one of said instances.

6. The method of claim 5, wherein generating a number of instances of the sampled value comprises applying the sampled value to a series of cascaded resistive-capacitive segments.

7. The method of claim 6, wherein the resistive-capacitive segments are tuned to smooth transient edges in the generated analog signal.

8. The method of claim 1, wherein the resistor network DAC comprises an R/2R ladder DAC.

9. The method of claim 1, wherein the resistor network DAC comprises a binary weighted resistor DAC.

10. The method of claim 1, wherein receiving input bit values of an n-bit digital word comprises receiving digital words of a baseband communication signal.

11. The method of claim 10, further comprising providing the analog signal to a current-mode low-pass filter circuit, for filtering in advance of current mode modulation.

12. A resistor network digital-to-analog converter, DAC, comprising:
   a set of bit input circuits configured to receive input bit values of an n-bit digital word, each said bit input circuit having an input sampling circuit configured to sample an input bit value and a driver circuit configured to apply the sampled value to an associated input resistor having a desired input resistor weight;
   an analog signal output circuit configured to generate an analog signal as a resistor-weighted sum of the input bit values;
   a clocking circuit comprising a multi-phase clock generator configured to subdivide each sampling clock cycle of the DAC into a number of phases; and
   wherein the input sampling circuit and the driver circuit of at least one bit input circuit comprise a number of parallel sampling circuits coupled to a corresponding number of parallel driver circuits, said parallel sampling circuits configured to each sample the input bit value at a different one of said phases and said parallel driver circuits configured to each apply the corresponding sampled value to a respective resistor branch, the parallel combination of all respective resistor branches forming the equivalent of the desired input resistor weight for that at least one bit input circuit.

13. The resistor network DAC of claim 12, wherein said parallel driver circuits comprise parallel slew-rate controlled driver circuits further configured to each smooth transient edges in the generated analog signal.

14. The resistor network DAC of claim 12, wherein at least one of said parallel driver circuits comprises an inverter circuit coupled to a current-mirror circuit tied to a slew-rate limiting current source.

15. The resistor network DAC of claim 14, wherein the slew-rate limiting current source is tuned to smooth transient edges in the generated analog signal.

16. The resistor network DAC of claim 12, wherein at least one of said parallel driver circuits comprises:
- a delay circuit configured to generate a number of instances of the sampled value, each instance being the sampled value delayed by an increasing number of delay units; and
- a parallel driver set circuit, each driver within the set having its input driven by a different one of said instances.

17. The resistor network DAC of claim 16, wherein the delay circuit comprises a series of cascaded resistive-capacitive segments.

18. The resistor network DAC of claim 17, wherein the resistive-capacitive segments are tuned to smooth transient edges in the generated analog signal.

19. The resistor network DAC of claim 12, wherein the resistor network DAC comprises an R/2R ladder DAC.

20. The resistor network DAC of claim 12, wherein the resistor network DAC comprises a binary weighted resistor DAC.

21. The resistor network DAC of claim 12, wherein the resistor network DAC comprises part of a communication transmitter and is configured to convert a baseband communication signal into an analog signal.

22. The resistor network DAC of claim 21, wherein the resistor network DAC is further configured to provide the analog signal to a current-mode low-pass filter circuit, for filtering in advance of current mode modulation.

23. A method of converting a digital signal into an analog signal via a resistor network digital-to-analog converter, DAC:
- receiving input bit values of an n-bit digital word on respective ones of a set of bit inputs, each bit input associated with an effective input resistance proportional to the desired contribution of the input bit value to the analog signal during a given sampling clock period; and
- for at least one bit input, spreading the desired contribution of the input bit value over the entire sampling clock period by cumulatively applying during successive time intervals the input bit value to parallel resistor branches whose parallel combination forms the effective input resistance.

24. The method of claim 23, wherein cumulatively applying during successive time intervals the input bit value to parallel resistor branches comprises applying the input bit value to each of said parallel resistor branches via a slew-rate controlled driver, to reduce signal transients arising from the application of the input bit value to the resistor network.

* * * * *